United States Patent [19]
Kinoshita et al.

[11] Patent Number: 5,625,214
[45] Date of Patent: Apr. 29, 1997

[54] SEMICONDUCTOR DEVICE

[75] Inventors: Yoshitaka Kinoshita, Koganei; Yukio Kawashima, Chitose; Hideaki Nakamura, Kodaira, all of Japan

[73] Assignees: Hitachi, Ltd.; Hitachi ULSI Engineering Corp., both of Tokyo, Japan

[21] Appl. No.: 525,214

[22] Filed: Sep. 8, 1995

Related U.S. Application Data

[63] Continuation of Ser. No. 323,939, Oct. 17, 1994, Pat. No. 5,495,118.

[30] Foreign Application Priority Data

Oct. 20, 1993 [JP] Japan .................................. 5-285958
Feb. 28, 1994 [JP] Japan .................................. 6-054507

[51] Int. Cl.$^6$ ....................................................... H01L 29/68
[52] U.S. Cl. ............................ 257/355; 257/369; 361/56
[58] Field of Search ....................................... 257/355, 356, 257/357, 360, 368, 369, 370, 401; 361/56, 91

[56] References Cited

U.S. PATENT DOCUMENTS 5,495,118  2/1996  Kinoshita et al. ...................... 257/355

*Primary Examiner*—Mark V. Prenty
*Attorney, Agent, or Firm*—Antonelli, Terry, Stout & Kraus, LLP

[57] ABSTRACT

Between an external terminal and the gate of one of output MOSFETs whose source or drain is connected to the external terminal, there is connected a P-channel type first protective MOSFET whose gate is connected to a high voltage side power supply terminal and which has a channel length equal to or larger than that of the output MOSFET, or an N-channel type second protective MOSFET whose gate is connected to a low voltage side power supply terminal and which has a channel length equal to or larger then that of the output MOSFET. When the external terminal is discharged by device charge, one of the protective MOSFETs is turned on, and the charge on the gate side of the output MOSFET can be likewise released by device charge to prevent ESD (Electro-Static Discharge) breakdown.

13 Claims, 12 Drawing Sheets

SEMICONDUCTOR DEVICE

This is a continuation of application Ser. No. 08/323,939, filed Oct. 17, 1994 now U.S. Pat. No. 5,495,118.

BACKGROUND OF THE INVENTION

The present invention relates to a semiconductor device and, more particularly, to a technique which is especially effective when applied to a large scale integrated circuit device including a data output buffer and a data input buffer and to an electrostatic breakdown preventing technique by a charge device model of the large scale integrated circuit device.

The electrostatic breakdown of a device is caused by Electro-Static Discharge (ESD). This ESD phenomenon is classified into the following three: (1) Human Body Model (HBD); (2) Charge Device Model (CDM); and (3) Field Induced Model. Of these, the charge device model includes the Charge Package Model (CPM). Of these, the field induced model is not considered to be serious because it hardly occurs.

In the human body model, an electrostatically charged human body comes into contact with a device so that the charge of the body is released to a pin of the device. If, at this time, another pin is connected to a potential, for example, to the earth, the discharge current flows through the device, resulting in breaking it down. A similar phenomenon occurs if a charged human brings a pin of a device into contact with a metal plate while holding the device with his or her hand. In a test circuit of this human body model, a capacitor likened to a human body is charged, and a resistor likened to the skin resistance is connected to a pin of the device. And, a voltage pulse is applied. A protective circuit premised by the human body model is disclosed in Japanese Patent Laid-Open No. 128872/1993.

As the automation technology has developed in recent years, devices are hardly handled by the human hand, so that the necessity for taking measures against the ESD breakdown according to the human body model is becoming lower and lower. As a result of the automation of the IC testing step and the device assembling step, on the contrary, devices tends to be frequently charged by friction of its package in transporting the device and by the contact with charged manufacturing apparatuses which is likened to the charge device model.

According to this charge device model, as shown in FIG. 18, when a device (LSI) approaches charged insulator, all its conductors (including the chip, the lead frame and the wires) are uniformly charged by the electrostatic induction, as shown by A. When the induced charge is released, as shown by B, an electrostatic breakdown occurs. Alternatively, as a result of the release of the induced charge, as shown by B, the device undergoes actual charge, as shown by C. When a lead is grounded to the earth, as shown in FIG. 19, a discharge occurs, causing an electrostatic breakdown. Thus, the ESD breakdown according to the charge model is caused with the result that the uniform charge in the conductors of the device is concentrated on the pads of the discharge pins.

SUMMARY OF THE INVENTION

In the charge model, the device is charged either positively or negatively by the friction of the package or electrostatic induction by the positive or negative charge of the aforementioned insulator, and countermeasures for the individual cases are required. In the aforementioned actual charged state, moreover, the charge is confined in the internal node, so that the protective MOSFET itself has to be protected. Therefore, it has been found by our investigations that the countermeasures are insufficient if directed to only high voltage pulses of negative polarity according to the human body model, as disclosed in the above-specified publication. It has been also found that, in the aforementioned charge device model, the protective transistor is liable to be broken down earlier than other components do, lowering the device reliability.

An object of the present invention is to provide a semiconductor device which is equipped with a protective circuit against the ESD breakdown of the input or output circuit due to the device charge.

Another object of the present invention is to provide a semiconductor device which can protect the output or input circuit effectively against the ESD breakdown due to the device charge.

The aforementioned and other objects and novel features of the present invention will become apparent from the following description with reference to the accompanying drawings.

A representative of the invention to be disclosed herein will be briefly summarized in the following. Between an external terminal and the gate of one of output MOSFETs whose source or drain is connected to the external terminal, there is connected a P-channel type first protective MOSFET whose gate is connected to a high voltage side power supply terminal and which has a channel length equal to of larger than that of the output MOSFET, or an N-channel type second protective MOSFET whose gate is connected to a low voltage side power supply terminal and which has a channel length equal to or larger than that of the output MOSFET.

According to the above-specified means, when the external terminal is discharged by device charge, one of the protective MOSFETs is turned on, and the charge on the gate side of the output MOSFET can be likewise released by device charge to prevent ESD breakdown.

Another representative of the invention to be disclosed herein will be briefly summarized in the following. Between an external terminal and the source or drain, for generating the output signal, of an input MOSFET whose gate is connected to the external terminal, there is connected a P-channel type third protective MOSFET whose gate is connected to a high voltage side power supply terminal, or an N-channel type fourth protective MOSFET whose gate is connected to a low voltage side power supply terminal.

According to the above means, when the external terminal is discharged by device charge, one of the protective MOSFETs is turned on, and the charge on the source or drain side of the output node of the input MOSFET can be likewise released by device charge to prevent ESD breakdown.

DETAILED DESCRIPTION OF THE INVENTION

Figure 1:
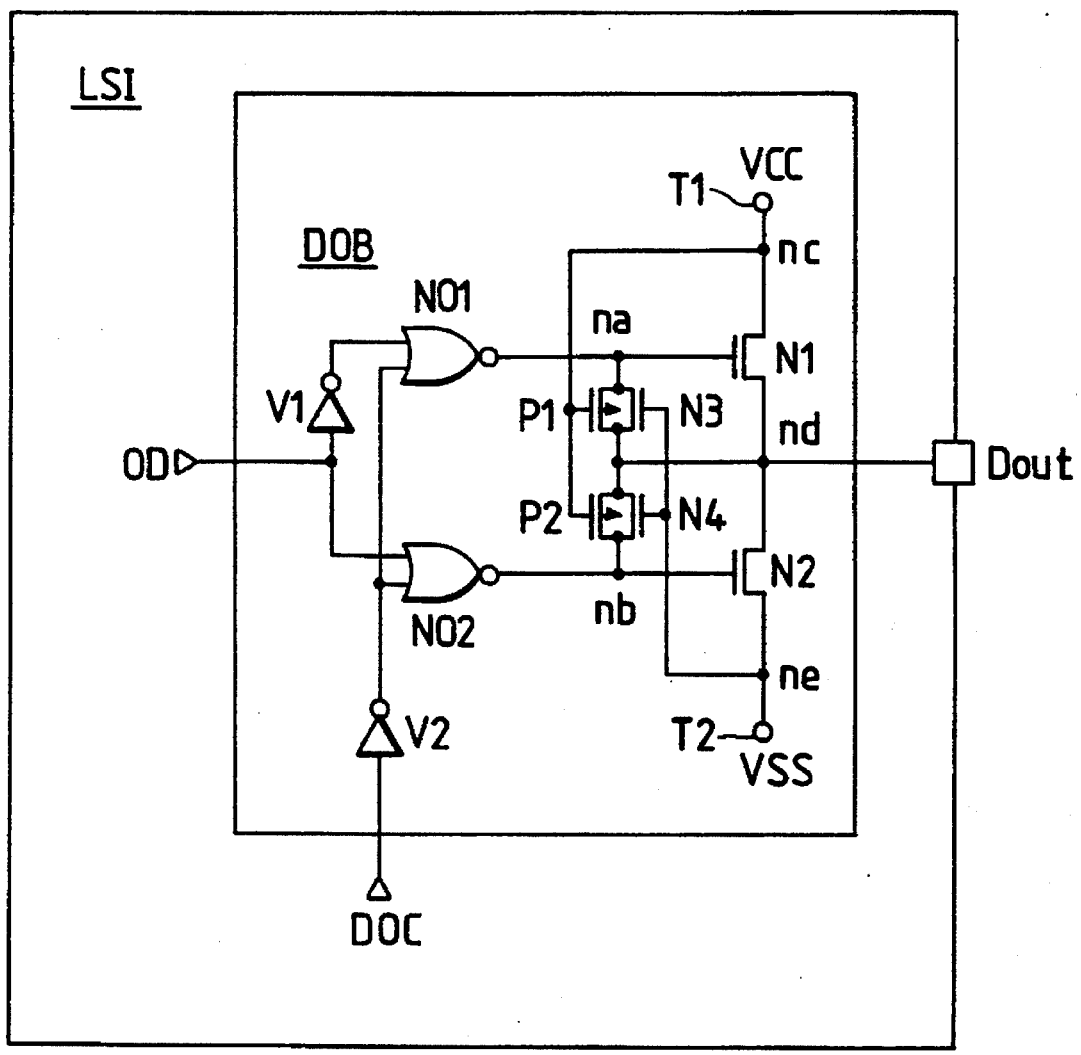
FIG. 1 is a circuit diagram showing an embodiment of a data output buffer according to the present invention.

FIG. 1 is a circuit diagram showing an embodiment of a data output buffer DOB according to the present invention. The individual circuit elements of FIG. 1 are formed together with a plurality of other similar data output buffers and/or not-shown input buffers and internal circuits into a large scale integrated circuit device LSI such as a dynamic RAM. Therefore, the individual circuit elements of FIG. 1 are formed, together with other circuit elements constituting a large scale integrated circuit device LSI, over a semiconductor substrate of single crystalline silicon by a well-known technique for fabricating a semiconductor integrated circuit.

In this embodiment, MOSFETs having their channels (or back gates) marked with arrows are of P-channel type, as discriminated from N-channel MOSFETs marked with no arrow. In the following description, terminals, including the corresponding bonding pads and bonding wires, are referred to as external terminals, the term "MOSFET" is used herein to mean an insulated gate field effect transistor (IGFET).

In FIG. 1, the data output buffer DOB of this embodiment includes an N-channel type output MOSFET N1 connected between a terminal T1 for receiving the high potential side power supply voltage of the circuit, i.e., a supply voltage VCC and an external terminal, i.e., a data output terminal Dour, and an N-channel type output MOSFET N2 connected between the data output terminal Dout and a terminal T2 for receiving the low potential side power supply voltage, i.e., the earth potential VSS. Of these, the gate of the output MOSFET N1, i.e., an internal node na is connected to the output terminal of a NOR gate circuit NO1, and the gate of the output MOSFET N2, i.e., an internal gate nb is connected to the output terminal of a NOR gate circuit NO2. This NOR gate circuit NO2 has an input terminal fed with an internal output signal OD from the not-shown preceeding-stage circuit of the data output buffer DOB, and the NOR gate circuit NO1 has an input terminal fed with an inverted signal inverted by an inverter V1. The other input terminals of the NOR gate circuits NO1 and NO2 are commonly fed with an inverted signal, which is generated by inverting an internal control signal DOC by an inverter V2, from a not-shown timing generator.

As a result, the output MOSFET N1 is turned on, when the output signal of the NOR gate circuit NO1, namely, the internal control signal DOC goes to a high level and the internal output signal OD goes a high level. Consequently the data output terminal Dour goes to a high level (i.e., VCC–Vth) which is lower than the power supply voltage VCC by its threshold voltage. On the other hand, the output MOSFET N2 is turned on when the output signal of the NOR gate circuit NO2, namely, the internal control signal DOC goes to a high level and the internal output signal OD goes to a low level. Consequently the data output terminal Dout goes to a low level such as the earth potential VSS.

In this embodiment, the data output buffer DOB is equipped with a protective N-channel type MOSFET N3 connected between the gate of the output MOSFET N1, i.e., the internal node na and the data output terminal Dout, and a protective N-channel type MOSFET N4 connected between the gate of the output MOSFET N2, i.e., the internal node nb and the data output terminal Dout. These protective MOSFETs N3 and N4 are commonly supplied with the low potential side power supply voltage of the circuit, i.e., the earth potential VSS. As a result, the MOSFETs N3 and N4 are normally off in the ordinary operation of the large scale integrated circuit device LSI, and no influence is exerted upon the operation of the data output buffer DOB.

There are further provided a protective P-channel type MOSFET P1 between the gate of the aforementioned output MOSFET N1, i.e., the internal node na and the data output terminal Dout and a protective P-channel type MOSFET P2 between the gate of the output MOSFET N2, i.e., the internal node nb and the data output terminal Dout. These protective MOSFETs P1 and P2 have their gates commonly connected to the aforementioned terminal T1. As a result, the MOSFETs P1 and P2 are normally off in the ordinary operation of the large scale integrated circuit device LSI, and no influence is exerted upon the operation of the data output buffer DOB.

The large scale integrated circuit device LSI having been packaged is charged by the so-called "charge device model", in which the device itself is charged due to the friction of the package or the contact with charged manufacturing apparatuses in the testing step or the assembling step. As a result of this charging of the package, the internal nodes na to ne of the data output buffer DOB are charged by electrostatic induction to a positive or negative potential having a relatively high absolute value. The positive or negative charge stored in the internal node nd, i.e., in the data output terminal Dout by the device charge is released to a lower potential when the data output terminal Dout comes into contact with a conductor such as a tool or a human body during the manufacture process. In the internal node na or nb, on the contrary, there is no discharge path when the aforementioned protective MOSFETs are not connected, so that a relatively high positive or negative voltage corresponding to the charge voltage of the internal node na and nb is applied between the gate and source of the output MOSFET N1 and between the gate and drain of the output MOSFET N2.

When the voltage of the gates of the protective N-channel type MOSFETs N3 and N4 is raised to a high level due to the device charge, the potential of the data output terminal Dout drops due to charge release by the contact with a conductor, and thereby the MOSFETs N3 and N4 are turned on. As a result, the charge stored in the internal nodes na and nb is released through those MOSFETs N3 and N4 to take the low potential. Against the aforementioned positive high voltage resulting from the device charge, therefore, the gate-source voltage of the output MOSFET N1 and the gate-drain voltage of the output MOSFET N2 can be lowered to prevent their oxide films from breaking down, thereby to enhance the reliability of the large scale integrated circuit device LSI.

When the voltage of the gates of the protective P-channel type MOSFETs P1 and P2 is raised to a high level due to the device charge, the potential of the data output terminal Dout drops due to charge release by the contact with a conductor, and thereby the MOSFETs P1 and P2 are turned on. As a result, the charge stored in the internal nodes na and nb is released through those MOSFETs P1 and P2 to take the low potential. Against the aforementioned positive high voltage resulting from the device charge, therefore, the gate-source voltage of the output MOSFET N1 and the gate-drain voltage of the output MOSFET N2 can be lowered to prevent their oxide films from breaking down, thereby to enhance the reliability of the large scale integrated circuit device LSI.

The output MOSFETs N1 and N2 are temporarily on when the positive high voltage is generated in the internal node na or nb, for a short time after the potential of the data output terminal Dout has lowered by the discharge and until the potentials of the gates, i.e., the aforementioned internal nodes na and nb lower. In this meanwhile, the positive charges stored in the internal node nc, i.e., the aforementioned terminal T1 and the internal node he, i.e., the aforementioned terminal T2 are released through the output MOSFETs N1 and N2 and the data output terminal Dout, respectively, so that the potentials of the internal nodes nc and ne lower. In the case of the negative voltage by the device charge, too, the output MOSFETs N1 and N2 are temporarily on due to the potential rise resulting from the discharge of the internal node na or nb, to release the negative charges stored in the internal node nc, i.e., the aforementioned terminal T1 and the internal node ne, i.e., the aforementioned terminal T2.

Figure 2:
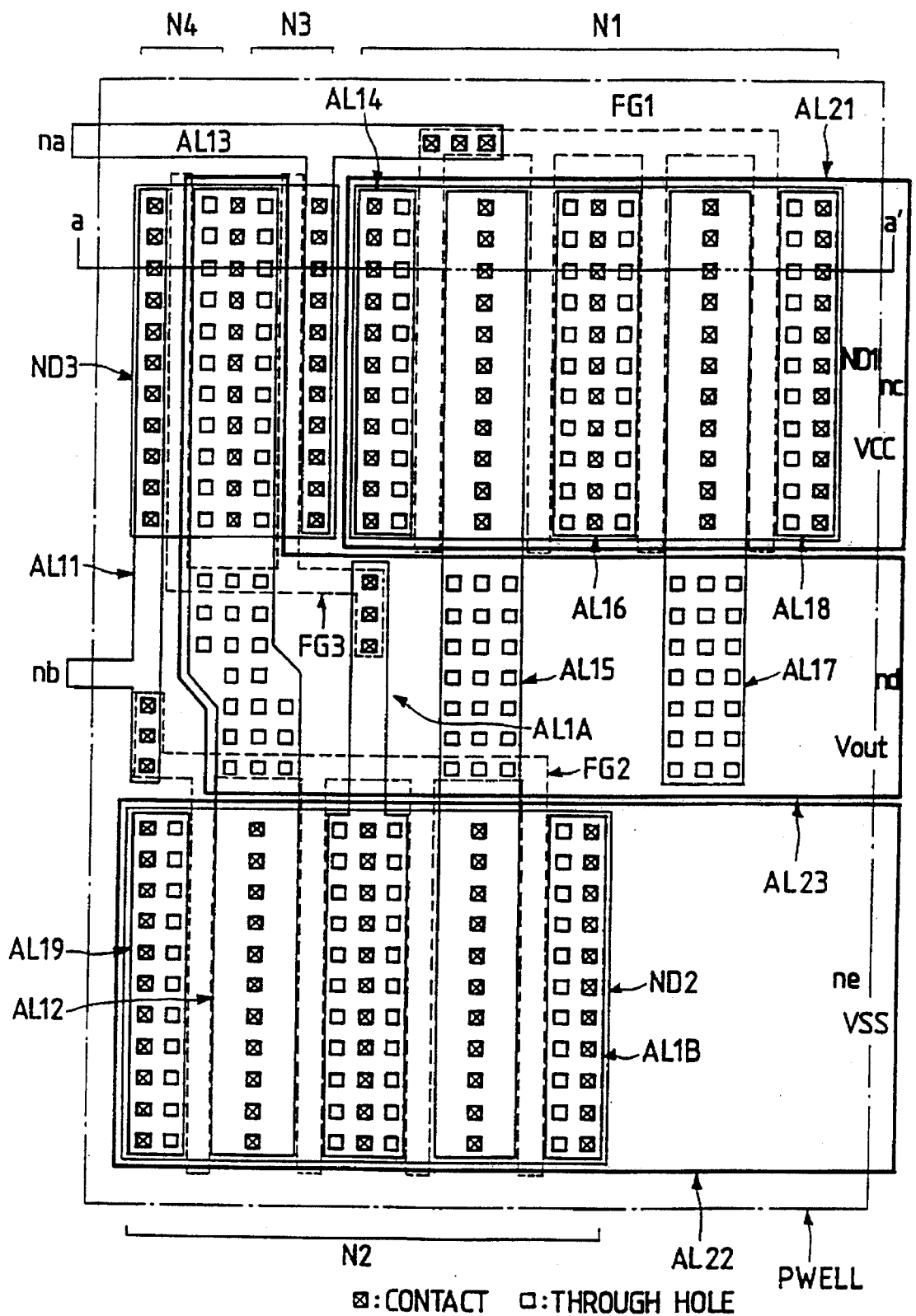
FIG. 2 is a top plan view showing of a portion of the embodiment of the data output buffer of FIG. 1.

FIG. 2 is a plan view showing a portion of the embodiment of the data output buffer DOB of FIG. 1. In FIG. 2, the aforementioned output MOSFETs N1 and N2 and the protective N-channel type MOSFETs N3 and N4 are shown as representatives by way of an example. With reference to FIG. 2, an outline of the partial layout and the features of the data output buffer DOB of this embodiment will be described in the following. Incidentally, in FIG. 2 a well region is shown by a single-dot and dash line and diffusion layers by the thinnest solid lines. Moreover, gate layers are shown by dotted lines, and first and second aluminum wiring layers are shown by thicker and the most thick solid lines, respectively.

In FIG. 2, the source and drain of the output MOSFET N1 constituting the data output buffer DOB of this embodiment comprise an N-type diffusion layer ND1 which is formed in a P-type well region PWELL over the N-type semiconductor substrate. This N-type diffusion layer ND1 is divided, for examples, by a four-branched gate layer FG1 made of polycrystalline silicon, into five portions. Of these, the most lefthand portion, the central portion and the most righthand portion are connected, through a plurality of contacts and through-holes corresponding to first aluminum wiring layers AL14, AL16 and AL18, to a second aluminum wiring layer AL21 to serve as the internal node nc, i.e., the supply voltage terminal T1. On the other hand, the remaining two portions are connected through connected through a plurality of corresponding contacts to first aluminum wiring layers AL15 and AL17, respectively, and further through a plurality of corresponding through-holes to a second aluminum wiring layer AL23 to serve as the internal node nd. This aluminum wiring layer AL23 is connected to not-shown bonding pads and further through bonding wires to the data output terminal Dout. The gate layer FG1 to serve as the gate of the MOSFET N1 is connected through a plurality of contacts to a first aluminum wiring layer AL13 to serve as the internal node na.

Likewise, the source and drain of the output MOSFET N2 constituting the data output buffer DOB comprise an N-type diffusion layer ND2 which is formed in the P-type well region PWELL. This N-type diffusion layer ND2 is also divided, for example, by a four-branched gate layer FG2 into five portions. Of these, the most lefthand portion, the central portion and the most righthand portion are connected, through a plurality of contacts and through-holes corresponding to first aluminum wiring layers AL19, AL1A and AL1B, to a second aluminum wiring layer AL22 to serve as the internal node ne, i.e., the earth potential terminal T2. On the other hand, the remaining two portions are connected through a plurality of corresponding contacts to first aluminum wiring layers AL12 and AL15 and further through a plurality of corresponding through-holes to the aforementioned second aluminum wiring layer AL23. The gate layer FG2 to serve as the gate of the MOSFET N2 is connected through a plurality of contacts to the first aluminum wiring layer AL11 to serve as the internal node nb.

The source and drain of the protective MOSFETs N3 and N4 provided for preventing electrostatic breakdown comprises an N-type diffusion layer ND3 which is formed in the P-type well region PWELL. This N-type diffusion layer ND3 is divided by a two-branched gate layer FG3 of polycrystalline silicon into three portions. Of these, the righthand portion to serve as the drain of the MOSFET N3 is connected through a plurality of contacts with the aforementioned first aluminum wiring layer AL13 to serve as the internal node na. On the other hand, the lefthand portion to serve as the drain of the MOSFET N4 is connected through a plurality of contacts to the aforementioned first aluminum wiring layer AL11 to serve as the internal node nb. Moreover, the central portion to serve as the sources of the MOSFETs N3 and N4 is connected through a plurality of contacts to the first aluminum wiring layer AL12 and further through a plurality of through-holes to the second aluminum wiring layer AL23 to serve as the internal node nd. The gate layer FG3 to serve as the gates of the MOSFETs N3 and N4 are connected through a plurality of contacts to the aforementioned first aluminum wiring layer AL1A and further to the second aluminum wiring layer AL22 to serve as the earth potential terminal T2.

As described hereinbefore, in the present embodiment, the MOSFETs N3 and N4 for preventing the oxide films of the output MOSFETs N1 and N2 from breaking down are arranged in the vicinity of the inside of the same P-type well region PWELL as that of the output MOSFETs N1 and N2. As a result, the wiring resistances between the MOSFETs N3 and N4 and the output MOSFETs N1 and N2 can be lowered to enhance the effect of preventing electrostatic breakdown. At the same time, the most righthand portion of the N-type diffusion layer ND3 for providing the source of the MOSFET N3 and the second portion from the left of the N-type diffusion layer ND1 to be connected to the data output terminal Dout and to serve as the source of the output MOSFET N1 are so arranged that the portions sandwich the most lefthand portion of the N-type diffusion layer ND1, that is, they are not adjacent to each other. By this arrangement, the breakdown voltage between those internal nodes, to which a relatively high voltage may be applied, can be enhanced.

Figure 3:
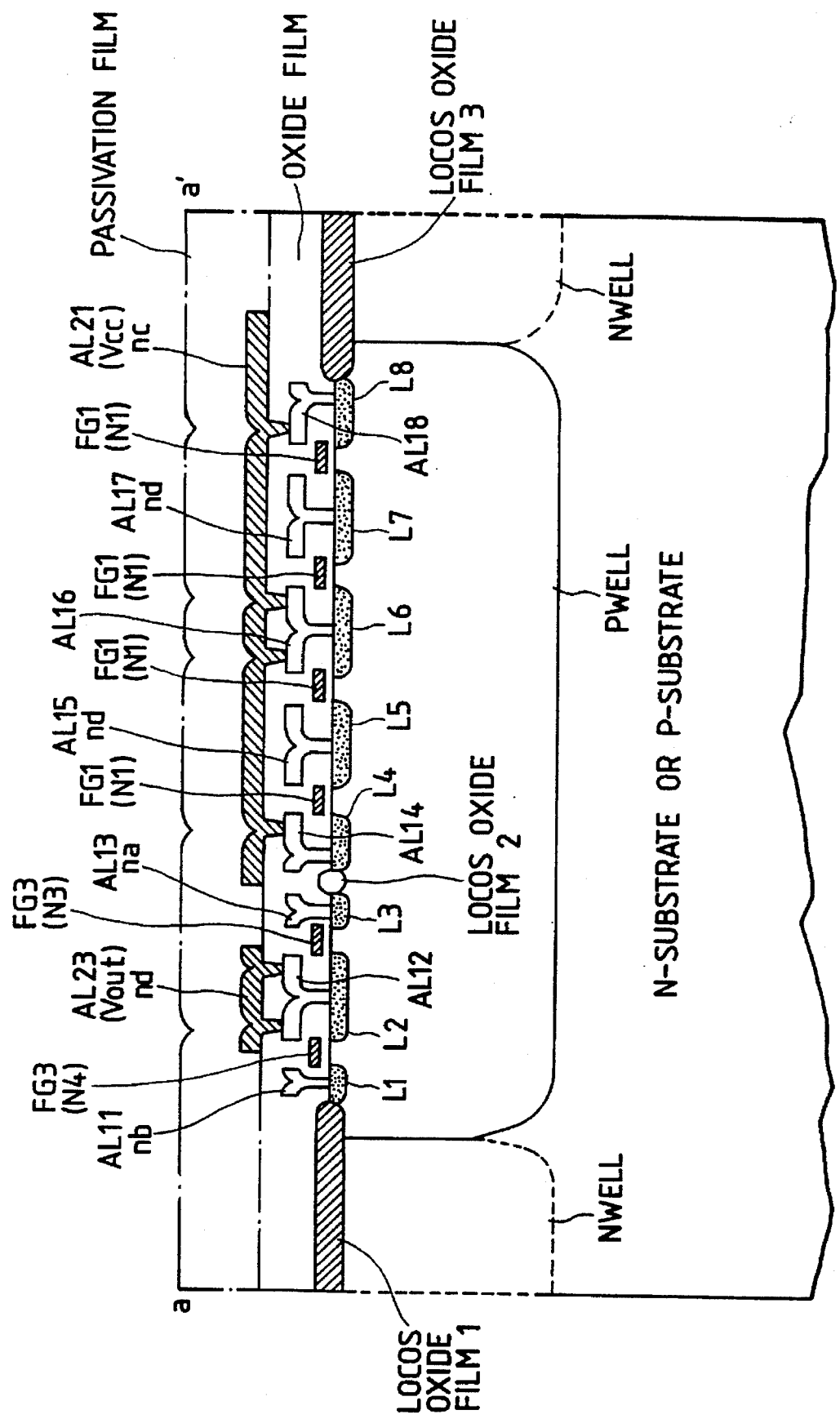
FIG. 3 is a schematic section taken along line a–a' of FIG. 2 and shows the element structure of the embodiment.

FIG. 3 is a schematic section taken along line a–a' of FIG. 2 and shows the element structure of the embodiment. In the well region PWELL in which the output MOSFET N1 (although N2 is not shown), the protecting MOSFETs N3 and N4 are also formed. Reference symbols L1 to L8 designate N-type diffusion layers where the sources and drains of those MOSFETs are formed.

Since the N-type diffusion layers L3 and L4 adjacent to each other through a LOCOS oxide film 2 constitute a parasitic lateral NPN transistor whole base is in the PWELL, it is necessary that the output node nd is not connected to either the diffusion layer L3 or L4. Alternatively, both the diffusion layers L3 and L4 may be connected to the output node nd. The reason is that when either the aforementioned diffusion layer L3 or L4 is connected to the output node nd and is grounded, that is, when the charge of the package is released, a potential difference may be established between the diffusion layers L3 and L4, resulting in discharge in the path of L3-PWELL-L4 and PN junction breakdown in the diffusion layer L3 or L4 due to the discharge current.

In this embodiment, therefore, the source and drain of the MOSFETs N3 and N4 commonly connected to the output node nd are formed in the diffusion layer L2, and the other source and drain connected to the internal node na are formed in the diffusion layer L3 so that the aforementioned parasitic lateral NPN transistor may be prevented from being turned on at the discharging time of the aforementioned output terminal (i.e., the node nd).

The other portions of the FIG. 3 showing the element structure are denoted by the same symbols of the aforementioned plan view of FIG. 2 and the part of the structure will be easily understood from the foregoing description.

Figure 4:
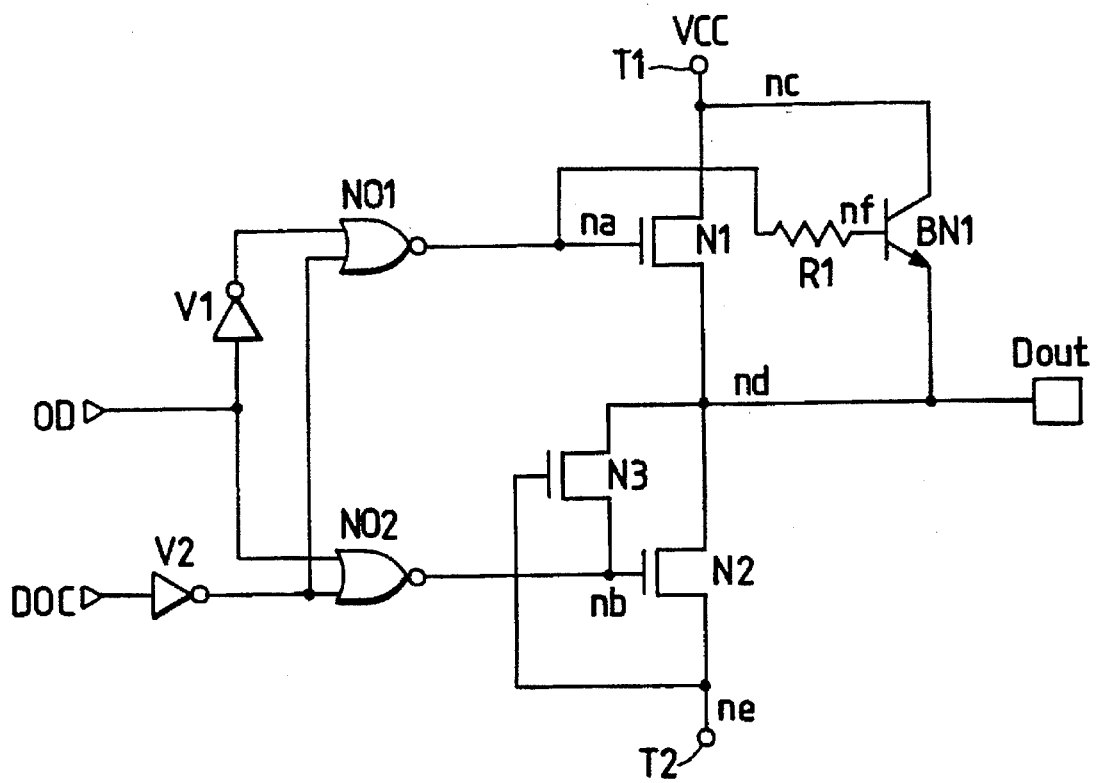
FIG. 4 is a circuit diagram showing another embodiment of a data output buffer according to the present invention.

FIG. 4 is a circuit diagram showing another embodiment of a data output buffer DOB according to the present invention. Element breakdown due to the device charge is stronger against negative charge in MOS devices because the electrostatic breakdown voltage due to negative charge is higher than that of positive charge. Considering this fact, a countermeasure is made in this embodiment exclusively against breakdown due to positive charge so as to simplify the circuit.

While protecting against the device charge the data output buffer, as structured like before, comprising the output MOSFETs N1 and N2, the NOR gate circuits NO1 and NO2 for switching the output MOSFETs N1 and N2 and the inverters V1 and V2, a bipolar type NPN transistor BN1 is connected in parallel with the output MOSFET N1 on the power supply voltage VCC side for accelerating the rise of the output signal. Specifically, the collector of this transistor BN1 is connected to the supply voltage terminal T1 together with the drain of the output MOSFET N1, the emitter is connected to the output terminal Dout and the base is connected through a resistor R1 to the gate (the internal node na) of the MOSFET N1.

For the output MOSFET N2 on the earth potential side, i.e., the low power supply voltage side, there is connected between the gate (the internal node nb) and the drain (the output node nd) thereof the protective N-channel type MOSFET N3, whose gate is connected to the earth potential point on the low voltage side, i.e., the terminal T2.

Figure 5:
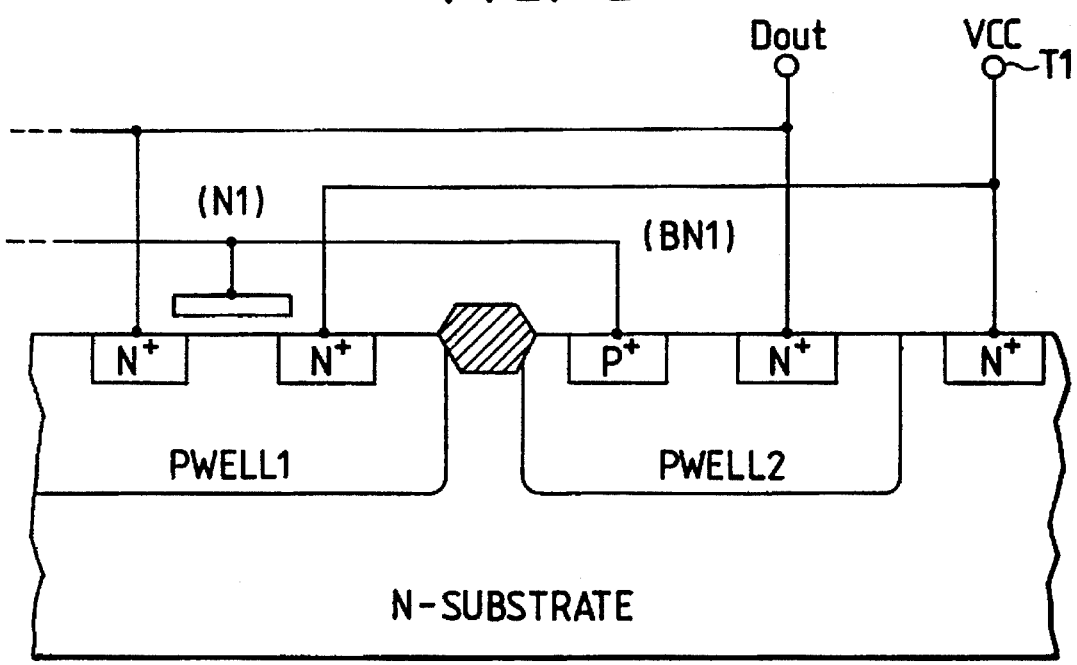
FIG. 5 is a schematic section showing the structure of an embodiment of the output MOSFET N1 and the bipolar transistor BN1 of FIG. 4.

FIG. 5 is a schematic section showing the structure of an embodiment of the output MOSFET N1 and the bipolar transistor BN1 of FIG. 4. The output MOSFET N1 is formed in a P-type well region PWELL1 which is formed over an N-type substrate. In this well region PWELL1 is further formed the other output MOSFET N2 and the protective MOSFET N3, although not shown.

The bipolar transistor BN1 is formed in a P-type well region PWELL2 which is formed adjacently thereto through a LOCOS oxide film, although not especially limited thereto. The PWELL 2 is formed simultaneously with the PWELL1 for forming the aforementioned N-channel type MOSFETS. Moreover, this PWELL2 is used as a base region, and an $N^+$-type diffusion layer is formed simultaneously with the source and drain diffusion layers of the N-channel type MOSFETs N1 to N3 and is used as an emitter region. A bias voltage of the power supply voltage VCC is applied to the N-type substrate so that the substrate is used as the collector. The emitter of the aforementioned bipolar transistor BN1 is connected to the output terminal Dout and the output node of the output MOSFET N1. The PWELL2 serving as the aforementioned base region is connected to an internal node such as the gate of the MOSFET N1. The drain of the output MOSFET N1 is connected to the aforementioned supply voltage terminal T1.

In this embodiment, when the internal node na connected to the gate of the output MOSFET N1 on the supply voltage side is positively charged, it is discharged through the base and emitter of the bipolar transistor BN1 by grounding the output terminal Dout. As a result, the aforementioned bipolar transistor BN1 acts as a protective element for the output MOSFET N1 on the supply voltage side. The node nc on the supply voltage side is discharged similarly through the aforementioned bipolar transistor BN1 and MOSFET N1.

In the output MOSFET N2 on the earth potential side, on the other hand, the internal node nb connected to the gate of the MOSFET N2 is discharged like before through the protecting MOSFET N3. The earth potential node ne is discharged through the MOSFET N2. These individual nodes na to ne are discharged substantially simultaneously when they contact with the conductor of the output terminal Dout at the earth potential. As a result, since there are no large potential differences between the individual nodes of the output buffer, that is, since they are discharged before the voltage reaches a value by which the gate insulating films of the output MOSFETs N1 and N2 are breakdown, ESD breakdown can be prevented.

In this embodiment, the bipolar transistor BN1 acts as an output transistor when the circuit is in operation. Specifically, when the output signal of the NOR gate circuit NO1 acting as the drive circuit goes to a high level, the bipolar transistor BN1 is turned on to feed the charge current to the output terminal Dout, together with the output MOSFET 1, so that the rise of the output signal can be accelerated. In short, the bipolar transistor BN1 of this embodiment has the two functions: prevention of the aforementioned ESD breakdown and acceleration of the operation.

Figure 6:
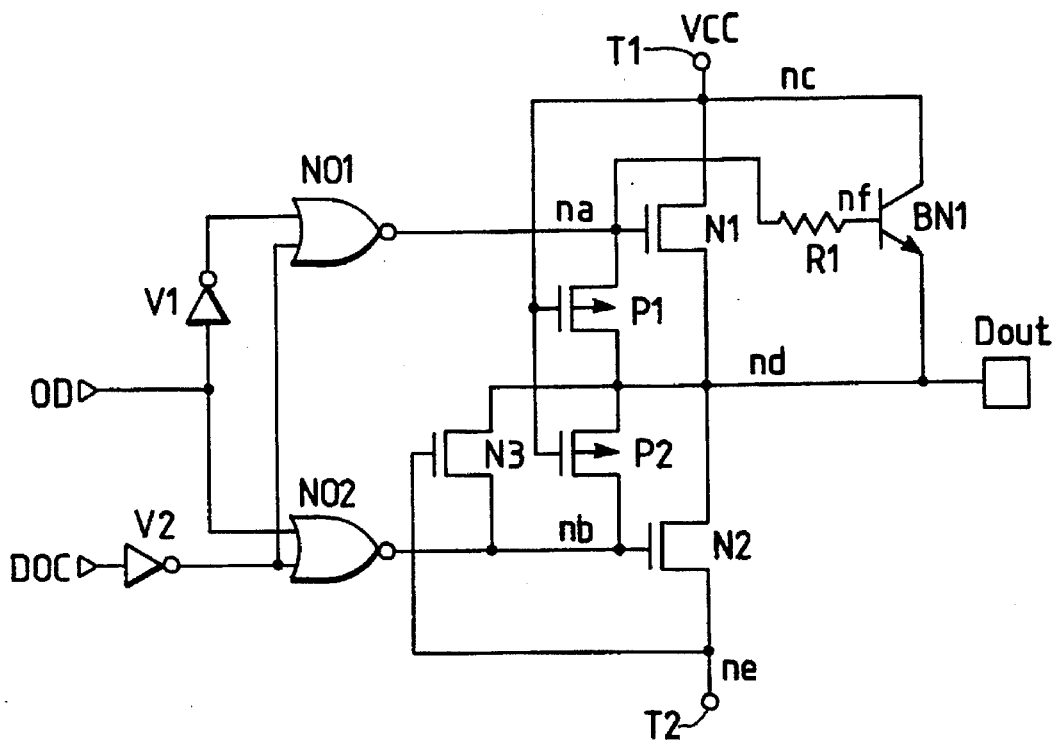
FIG. 6 is a circuit diagram showing another embodiment of a data output buffer according to the present invention.

FIG. 6 is a circuit diagram showing another embodiment of a data output buffer DOB according to the present invention. In this embodiment, the countermeasure for preventing the ESD breakdown by the negative charge is also adopted as in the foregoing embodiment of FIG. 4 so as to complete the prevention of the element breakdown by the device charge.

In this embodiment, in addition to the output buffer of the foregoing embodiment of FIG. 4, the protecting P-channel type MOSFETs P1 and P2 are provided between the gate (the internal node na) and the output node (nd) of the output MOSFET N1 and between the drain (the output node nd) and the gate (the internal node nb) of the output MOSFET N2. The gates of the MOSFETs P1 and P2 are connected commonly to the supply voltage terminal T1 (the node nc).

In this embodiment, ESD breakdown is prevented by the bipolar transistor BN1 and the N-channel type MOSFET N3 when positively charged like before. When negatively charged, ESD breakdown is prevented because the P-channel type MOSFETs P1 and P2 are turned on as in the foregoing embodiment of FIG. 1.

Figure 7:
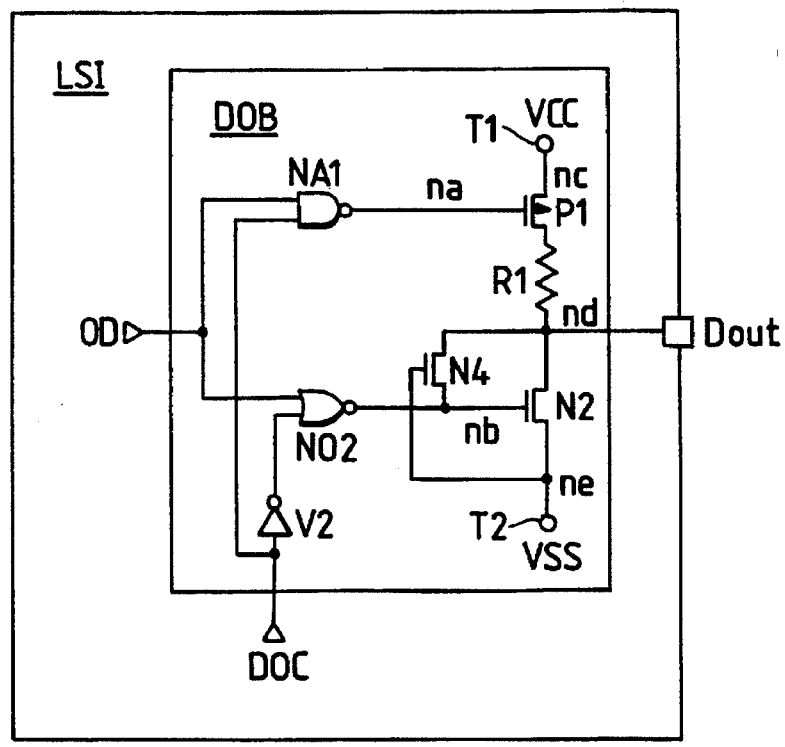
FIG. 7 is a circuit diagram showing another embodiment of a data output buffer according to the present invention.

FIG. 7 is a circuit diagram showing another embodiment of a data output buffer DOB according to the present invention. In this embodiment, a CMOS construction which is composed of a P-channel type output MOSFET P1 and an N-channel type output MOSFET N2 is adopted. In this case of the CMOS construction, the gate of the P-channel type output MOSFET P1 is fed with a drive signal by a NAND gate circuit NA1. In response to this, the input terminal of the NAND gate circuit NA1 is fed directly with an output signal DO and a control signal DOC. Since, in this embodiment, the P-channel type output MOSFET P1 has a higher electrostatic breakdown voltage (of the charge device model) than that of the N-channel type output MOSFET N1, only the N-channel type output MOSFET N2 is equipped with a protective N-channel type MOSFET N4 like the aforementioned one so as to simplify the circuit.

It is empirically known that the P-channel type output MOSFET P1 has a higher electrostatic breakdown voltage, as described above. The reason is as follows. Since a diffusion resistor R1 of about 10 to 20Ω for prevention of latch-up is connected between the drain of the P-channel type output MOSFET P1 and the output terminal Dout, the discharge current waveform is blunted to delay the change in the drain potential, and the P-channel type MOSFET has a higher gate oxide film breakdown voltage than that of the N-channel type MOSFET.

Figure 8:
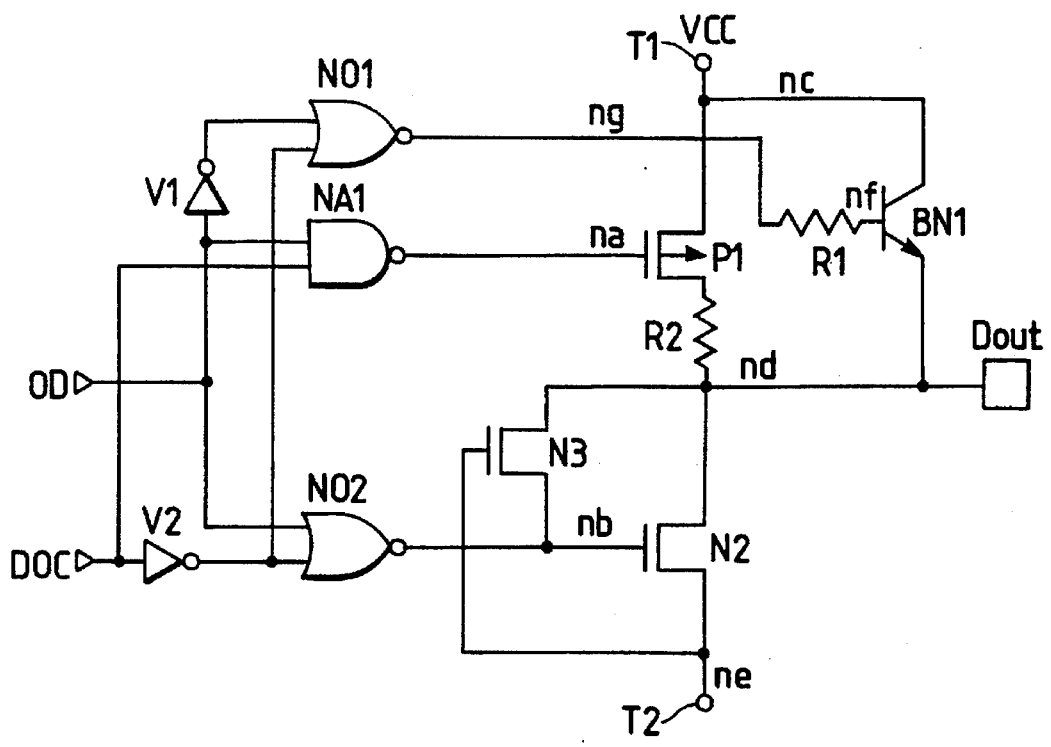
FIG. 8 is a circuit diagram showing another embodiment of a data output buffer according to the present invention.

FIG. 8 is a circuit diagram showing another embodiment of a data output buffer DOB according to the present invention. As in the foregoing embodiment of FIG. 7, this embodiment has a CMOS construction which is composed of a P-channel type output MOSFET P1 and an N-channel type output MOSFET N2. In this case of the CMOS construction, the P-channel type MOSFET P1 has a low current driving ability to delay the rise of the output relatively. Therefore, this embodiment is equipped with a bipolar transistor BN1 as in the foregoing embodiment of FIG. 4. As a result, when the output buffer is in operation, the current of the bipolar transistor BN1 dominantly acts to accelerate the rise of the output signal, so that the output level is raised to the supply voltage VCC by the P-channel type MOSFET P1 and the output high level margin is enlarged.

As a countermeasure against ESD breakdown, the output MOSFET N2 is protected like before by the protective N-channel type MOSFET N3. The protection of the P-channel type MOSFET P1 is substantially effected by gentle change of the drain potential, which is achieved by the high electrostatic breakdown voltage of the gate insulating film of the MOSFET P1 and by the action of a diffusion resistor R2. For the bipolar transistor BN1, on the other hand, no special countermeasure against electrostatic breakdown is required unlike the MOSFET because an internal node ng is discharged by the PN junction between the base and emitter.

Figure 9:
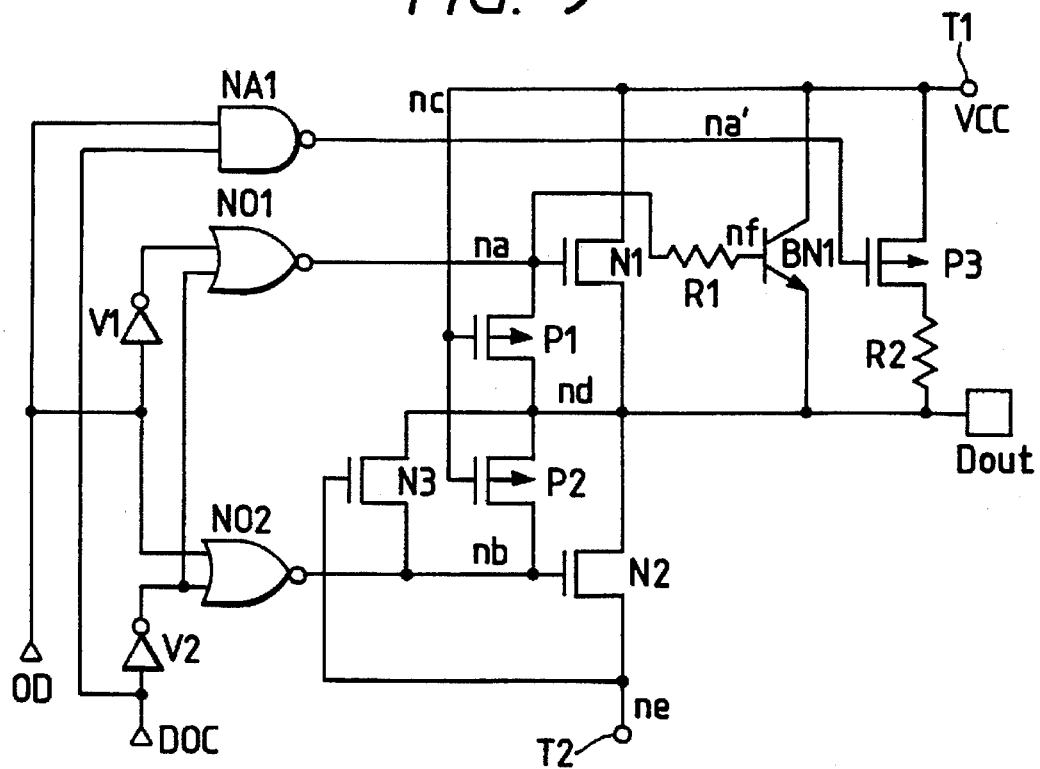
FIG. 9 is a circuit diagram showing another embodiment of a data output buffer according to the present invention.

FIG. 9 is a circuit diagram showing another embodiment of a data output buffer DOB according to the present invention. In this embodiment, an N-channel type output MOSFET N1 is added as an output MOSFET of the supply voltage side to the foregoing embodiment of FIG. 8. This is because the rise of the output voltage to a high level is substantially accelerated by the bipolar transistor and the N-channel type output MOSFET so that a large current may be made to flown in a small element size. A P-channel type output MOSFET P3 fills a role of compensating the level of the output voltage so as to raise the level to the supply voltage VCC after the bipolar transistor BN1 is turned off when the output voltage reaches the level of VCC-VBE (the base-emitter voltage of the bipolar transistor BN1) and after the MOSFET N1 is turned off when the same reaches the level of VCC−Vth (the threshold voltage of the MOSFET N1). Thus, since the P-channel type MOSFET P3 compensates the output level, it can be small-sized. By this level compensation, the supply voltage VCC can be lowered.

In this embodiment, the countermeasure of the P-channel type output MOSFET P3 against ESD is omitted because the diffusion resistor R2 for preventing latch-up and so on are provided, and the preventing of breakdown of the N-channel type output MOSFET N1 by the positive charge is effected by the bipolar transistor BN1. The prevention of breakdown of the output MOSFET N2 on the earth potential side by the positive charge is effected by the protective N-channel type MOSFET N3 like the aforementioned one. In order to more ensure the prevention of breakdown due to negative charge, protective P-channel type MOSFETs P1 and P2 are connected between the source and gate of the N-channel type output MOSFETs N1 and N2 and the output node.

Figure 10:
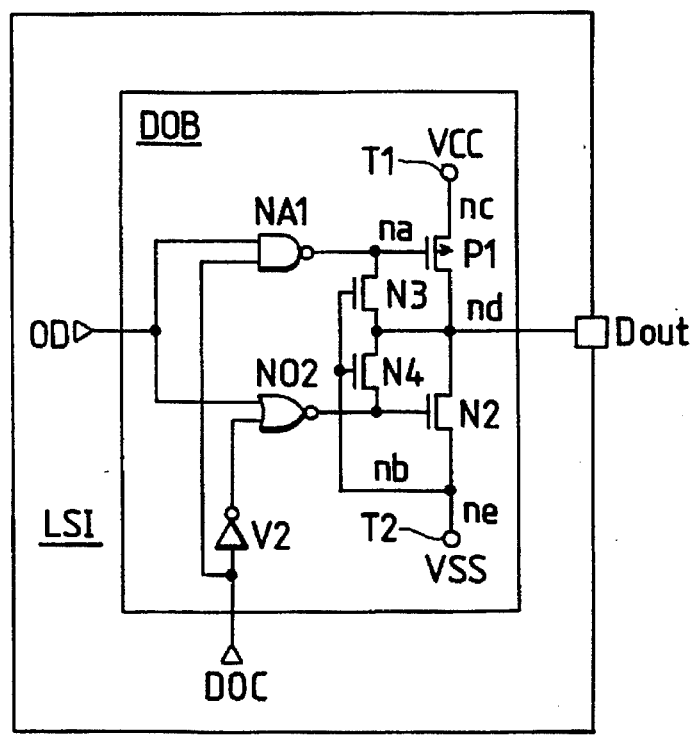
FIG. 10 is a circuit diagram showing another embodiment of a data output buffer according to the present invention.

FIG. 10 is a circuit diagram showing another embodiment of a data output buffer DOB according to the present invention. This embodiment is directed to an output buffer having a CMOS construction. Specifically, the P-channel type output MOSFET P1 and the N-channel type output MOSFET N2 constitute the output circuit. As the drive circuits, a NAND gate circuit NA1 is connected to the gate of the P-channel type output MOSFET P1, and a NOR gate circuit NO2 is connected to the gate of the N-channel type output MOSFET N2. The aforementioned gate circuits NA1 and NO2 are fed at their inputs with a signal DO to be outputted. The other input of the gate circuit NA1 is fed with a control signal DOC, and the other input of the gate circuit NO2 is fed with the inverted signal generated by the inverter circuit V2 by inverting the control signal DOC.

In order that ESD breakdown by positive charge may be prevented by device charge in such data output buffer, protective N-channel type MOSFETs. N3 and N4 are connected between the gates of the output MOSFETs P1 and N1 and the output. The gates of the N-channel type MOSFETs N3 and N4 are connected to the earth potential terminal T2 of the circuit. As a result, when the data output buffer is in operation, both protective MOSFETs N3 and N4 are steadily off to exert no adverse effect upon the outputting operation.

In the large scale integrated circuit device LSI sealed in a package, when the internal nodes na to ne of the data output buffer DOB are brought to positive potentials of relatively large absolute values by the charge of the charge device model, and when the positive charge stored in the output terminal Dout is released to render the nodes na to ne low in potential as a result of contact with a conductor, the protecting MOSFETs N3 and N4 are turned on to lower a relatively high positive voltage corresponding to the charge voltage of the internal nodes na and nb by discharge, and thereby to protect the output MOSFETs P1 and N2 from the ESD breakdown. Incidentally, the P-channel type output MOSFET P1 is equipped on its output side with the aforementioned diffusion resistor for preventing the patch-up, which is omitted in FIG. 10.

Figure 11:
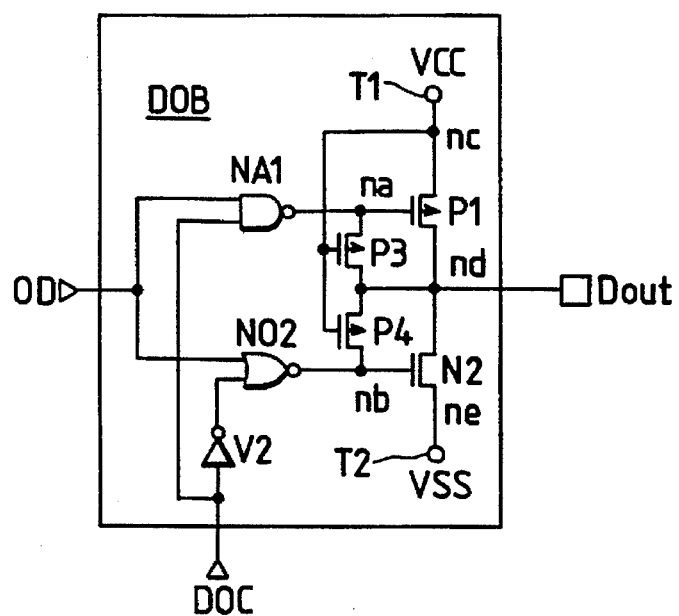
FIG. 11 is a circuit diagram showing another embodiment of a data output buffer according to the present invention.

FIG. 11 is a circuit diagram showing another embodiment of a data output buffer DOB according to the present invention. This embodiment is directed to the output buffer having a CMOS construction a countermeasure against the ESD breakdown for a negative charge unlike the embodiment of FIG. 10. In short, there are connected between the gates of the output MOSFETs P1 and N1 and the output the protective P-channel type MOSFETs P3 and P4. The gates of these P-channel type MOSFETs P3 and P4 are connected with the supply voltage terminal T1. As a result, when the data output buffer is in operation, both those protective MOSFETs P3 and P4 are steadily off to exert no adverse effect upon the outputting operation.

The internal nodes na to ne of the data output buffer DOB are made to have negative potentials by the charging operation of the charge device model. When the negative charge stored in the output terminal Dout is released to the low potential as a result of the contact with a conductor, the protective MOSFETs P3 and P4 are turned on to lose a relatively high negative voltage corresponding to the charge voltage of the internal nodes na and nb thereby to prevent ESD breakdown of the output MOSFETs P1 and N2.

Figure 12:
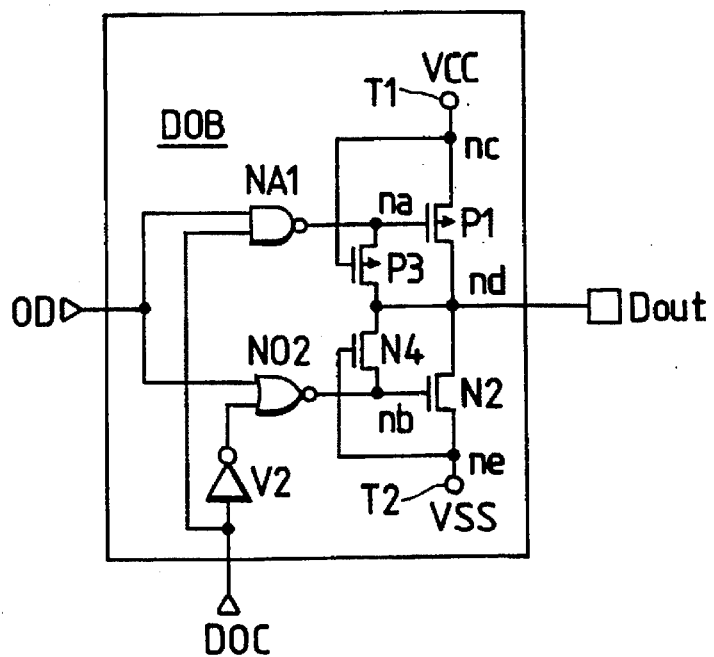
FIG. 12 is a circuit diagram showing another embodiment of a data output buffer according to the present invention.

FIG. 12 is a circuit diagram showing another embodiment of a data output buffer DOB according to the present invention. This embodiment is an output buffer having a CMOS construction. Unlike the embodiments of FIG. 10 and FIG. 11, a countermeasure against ESD breakdown is taken for a P-channel type output MOSFET P1 when negatively charged and for an N-channel type MOSFET N2 when positively charged. In short, there are connected between the gates of the output MOSFETs P1 and N1 and the output the aforementioned protective P-channel type MOSFET P3 and N-channel type MOSFET N4 for the protecting operation similar to the aforementioned one.

Figure 13:
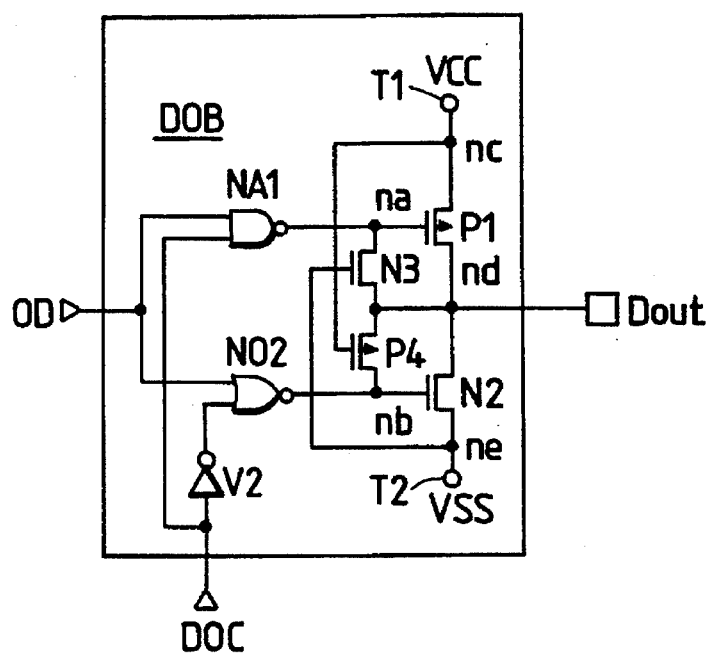
FIG. 13 is a circuit diagram showing another embodiment of a data output buffer according to the present invention.

FIG. 13 is a circuit diagram showing another embodiment of a data output buffer DOB according to the present invention. This embodiment is an output buffer having a CMOS construction. Contrary to the embodiment of FIG. 12, a countermeasure against ESD breakdown is taken for the P-channel type output MOSFET P1 when positively charged, and a countermeasure is taken against ESD breakdown for the N-channel type MOSFET N2 when negatively charged. In short, there are connected between the gates of the output MOSFETs P1 and N1 and the output the aforementioned protecting N-channel type MOSFET N3 and P-channel type MOSFET P4 for the protecting operation similar to the aforementioned one.

Figure 14:
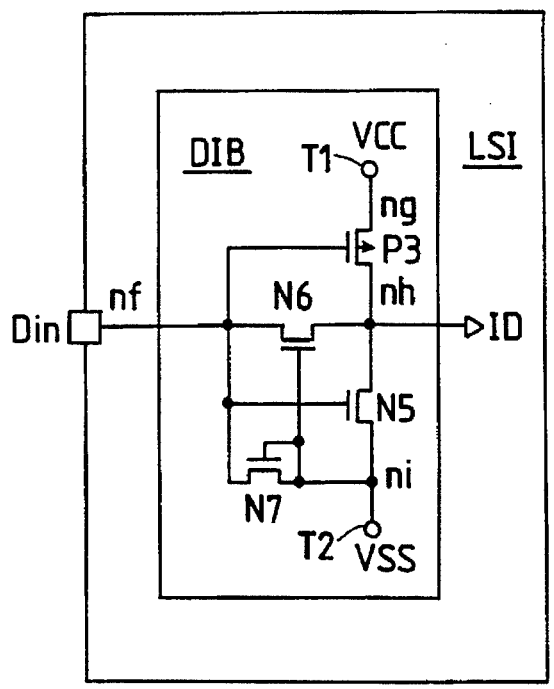
FIG. 14 is a circuit diagram showing an embodiment of a data input buffer according to the present invention.

FIG. 14 is a circuit diagram showing an embodiment of a data input buffer DIB according to the present invention. With reference to FIG. 14, the summary of the construction and operation, and the feature of the data input buffer DIB of this embodiment will be described in the following. Incidentally, the data input buffer DIB of this embodiment is packaged together with the aforementioned data output buffer DOB and other similar data input buffers in the large scale integrated circuit device LSI such as a static RAM, although not especially limited thereto.

In FIG. 14, the data input buffer DIB of this embodiment includes a P-channel type input MOSFET P3 and an N-channel type input MOSFET N5 whose gates are connected commonly as an internal node nf to an external terminal, i.e., a data input terminal Din. Of these, the source of the input MOSFET P3 is connected to the internal node ng, i.e., the supply voltage terminal T1, and the source of the input MOSFET N5 is connected to an internal node ni, i.e., the earth potential terminal T2. The drains of these input MOSFETs are connected commonly as an internal node nh, and the potentials are fed as an internal input signal ID to a not-shown succeeding-stage circuit of the data input buffer DIB. As a result, the internal input signal ID is made to go a low level such as the earth potential VSS when the potential of the data input terminal Din is made to go to a predetermined high level, and it is made to go a high level such as the supply voltage VCC when the potential of the data input terminal Din is made to go a predetermined low level.

In this embodiment, the data input buffer DIB is further equipped with an N-channel type MOSFET N6 between the internal node nf, i.e., the data input terminal Din and the internal node nh, i.e., the commonly connected drains of the input MOSFETs P3 and N5, and another N-channel type MOSFET N7 between the internal node nf, i.e., the data input terminal Din and the internal node ni, i.e., the earth potential terminal T2. The gates of these MOSFETs N6 and N7 are connected to each other and to the lower potential side supply voltage terminal of the circuit, i.e., the terminal T2. As a result, the MOSFETs N6 and N7 are steadily off in the ordinary operation of the large scale integrated circuit device LSI, so that they exert no influence upon the operation of the data input buffer DIB.

In the large scale integrated circuit device LSI packaged, the internal nodes nf to ni of the data input buffer DIB is set to positive potentials having relatively high absolute values by the charging operation of the charge device model. Moreover, the positive charge stored in the internal node nf, i.e., the potential of the data input terminal Din raised by the device charge is lowered as a result of the contact with a conductor, so that a relatively high positive voltage corresponding to the charge voltages of the internal nodes nh and ni will be applied between the gate and drain of the input MOSFET P3 and between the gate and source, and the gate and drain of the input MOSFET N5.

In the data input buffer DIB of this embodiment, as described above, there are connected, between the gates and drains of the input MOSFETs P3 and N5 and the gate and source of the input MOSFET N5, the MOSFETs N6 and N7 whose gates are commonly connected to the earth potential VSS. These MOSFETs N6 and N7 are selectively turned off when their gates, i.e., the internal node ni is set to the high voltage by device charge and when the potential of their sources, i.e., the data input terminal Din is lowered as a result of the discharge due to the contact with a conductor. As a result, the charge stored in the internal nodes nh and ni is released from those MOSFETs N6 and N7 through the data-input terminal Din to take a low potential. As a result, the gate-drain voltages of the input MOSFETs P3 and N5 can be lowered to prevent the oxide film breakdown of the input MOSFETs from breaking down thereby to enhance the reliability of the large scale integrated circuit device LSI and to release the charge, which is stored in the internal node ni having no discharge path, i.e., the earth potential terminal T2, through the MOSFET N7 by the device discharge.

The input MOSFET P3 is on together with the MOSFET N6 for the time period after the potential of the data input terminal Din is lowered by the discharge and until the potential of the drain, i.e., the internal node nh has is lowered. In this meanwhile, the positive charge stored in the internal node ng, i.e., the supply voltage terminal T1 by the device charge is released through the input MOSFET P3 and MOSFET N6, so that the potential of the internal node ng is lowered. On the other hand, the MOSFETs N6 and N7 are turned off when the gates are fed with the earth potential VSS while the large scale integrated circuit device LSI is in an ordinary state, so that they exert no influence upon the operation of the large scale integrated circuit device LSI.

Figure 15:
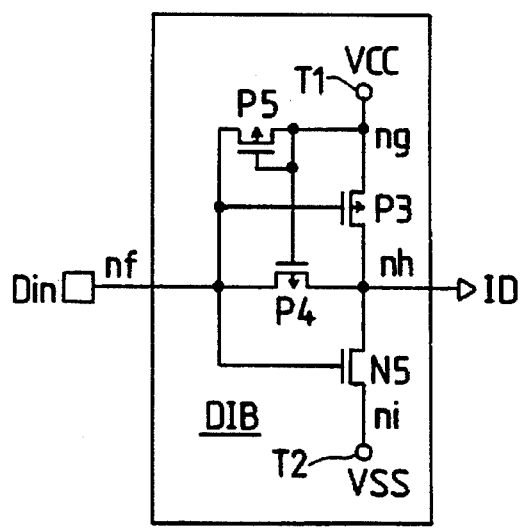
FIG. 15 is a circuit diagram showing another embodiment of a data input buffer according to the present invention.

FIG. 15 is a circuit diagram showing another embodiment of a data input buffer DIB according to the present intention. Incidentally, this embodiment follows the foregoing embodiment of FIG. 14 basically, and an additional description will be made upon only the portions different from those of FIG. 15. Moreover, this embodiment is effective only in the case where the internal nodes nf to ni of the data input buffer DIB are charged to negative potentials, as will become apparent from the following reasons.

In FIG. 15, the data input buffer DIB of this embodiment is equipped with a P-channel type MOSFET P4 connected between the internal node nf, i.e., the data input terminal Din and the internal node nh, i.e., the commonly coupled drains of the input MOSFETs P3 and N5, and another P-channel type MOSFET P5 connected between the internal node nf, i.e., the data input terminal Din and the internal node ng, i.e, the supply voltage terminal T1. The gates of these MOSFETs P4 and P5 are connected to each other and then to the higher potential side supply voltage terminal of the circuit, i.e., the terminal T1 for receiving the supply voltage VCC. As a result, the MOSFETs P4 and P5 are steadily off in the ordinary state of the large scale integrated circuit device LSI, so that they will exert no influence upon the operation of the data input buffer DIB.

Like before, the large scale integrated circuit device LSI receives the charge by charge device model in a testing step or in an assembling step. After the nodes nf to ni of the data input buffer DIB are charged to the negative potentials by electrostatic induction, the negative charge stored in the internal rode nf, i.e., the data input terminal Din is released by contact with a conductor. Then, the gates of the MOSFETs P4 and P5, i.e., the internal node ng is charged with a negative potential by device charge, and the potentials of their sources, i.e., the data input terminal Din are raised to a high potential as a result of contact with a conductor, so that they are selectively turned on. As a result, the negative charge stored in the internal nodes ng and nh is released through the MOSFETs P4 and P5, and consequently the potential of the nodes ng and nh are raised. The gate-drain voltages of the input MOSFETs P3 and NS, therefore, can be lowered to prevent the oxide film breakdown thereby to enhance the reliability of the large scale integrated circuit device LSI. At the same time, the negative charge stored in the internal node ng having no discharge path, i.e., the supply voltage terminal T1 can be released through the MOSFET P5.

The input MOSFET N5 is turned on together with the MOSFET P4 for the time period after the potential of the data input terminal Din is raised by discharge and until the drain, i.e., the internal node nh is raised. In this meanwhile, the negative charge stored in the internal node ni, i.e., the earth potential terminal T2 by device charge is released through the input MOSFET N5 and MOSFET P4, so that the potential of the internal node ni is raised. The MOSFETs P4 and P5 are turned off when the gates are fed with the supply voltage VCC while the large scale integrated circuit device LSI is in the ordinary operation, so that no influence is exerted upon the operation of the large scale integrated circuit device LSI.

Figure 16:
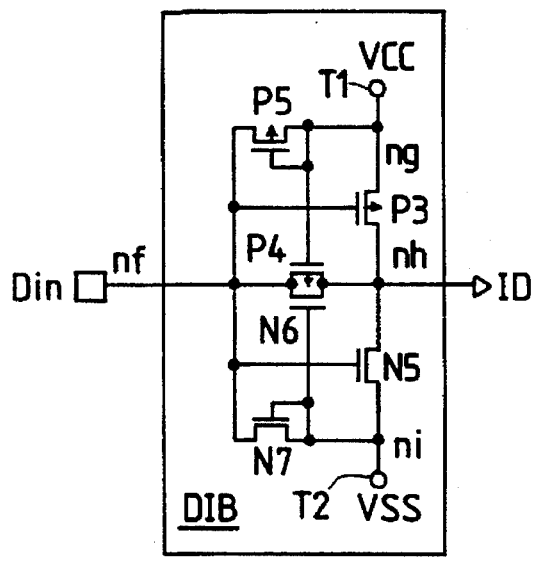
FIG. 16 is a circuit diagram showing another embodiment of a data input buffer according to the present invention.

FIG. 16 is a circuit diagram showing still another embodiment of the data input buffer DIB to which is applied the present invention. Incidentally, this embodiment is a combination of the foregoing embodiments of FIG. 14 and FIG. 15 to prevent electrostatic breakdown caused by positive charge and the negative charge.

Figure 17A:
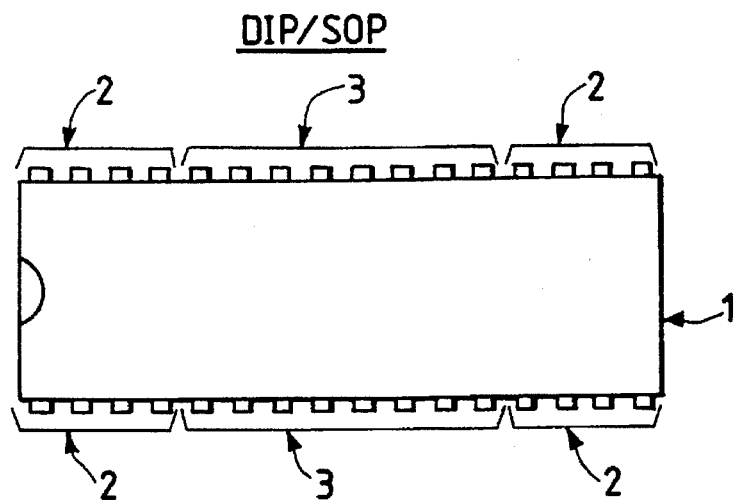
FIG. 17A, FIG. 17B and FIG. 17C are external views showing an embodiment of a semiconductor device to which the present invention is applied.
Figure 17B:
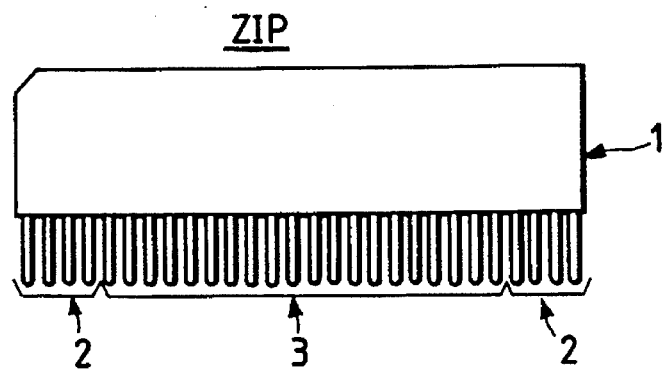
Figure 17C:
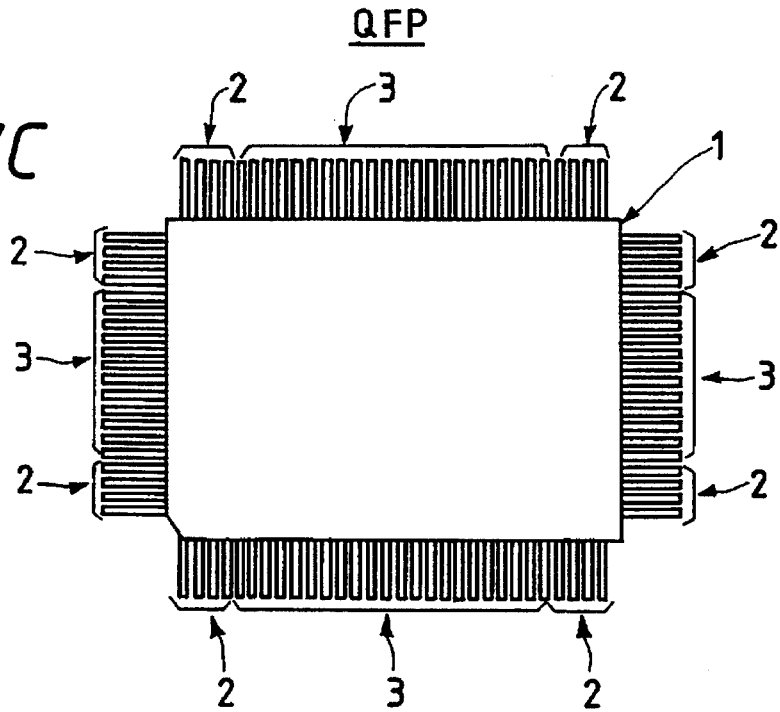
Figure 18:
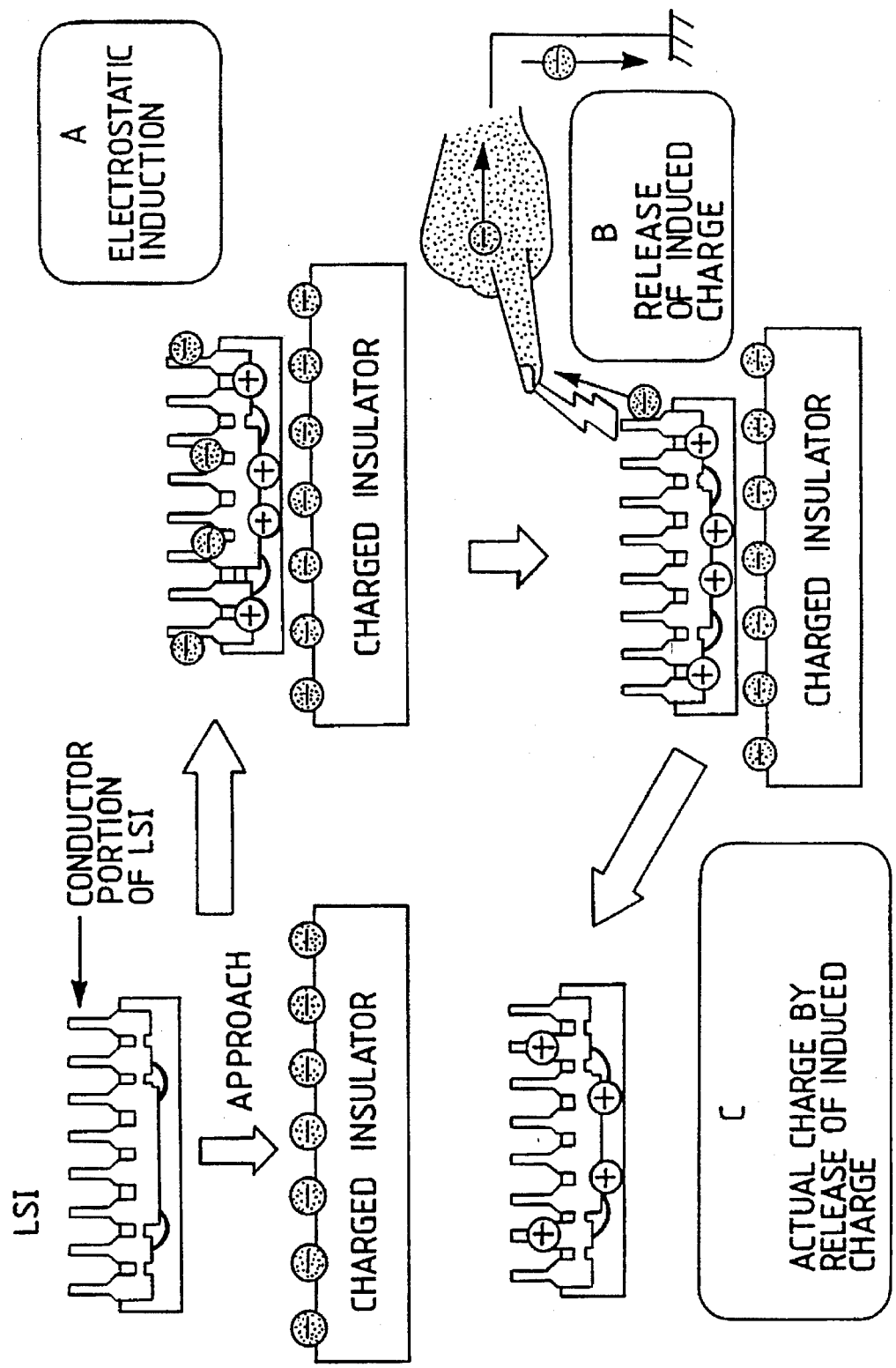
FIG. 18 is an explanatory view for explaining the principle of a charge device model.
Figure 19:
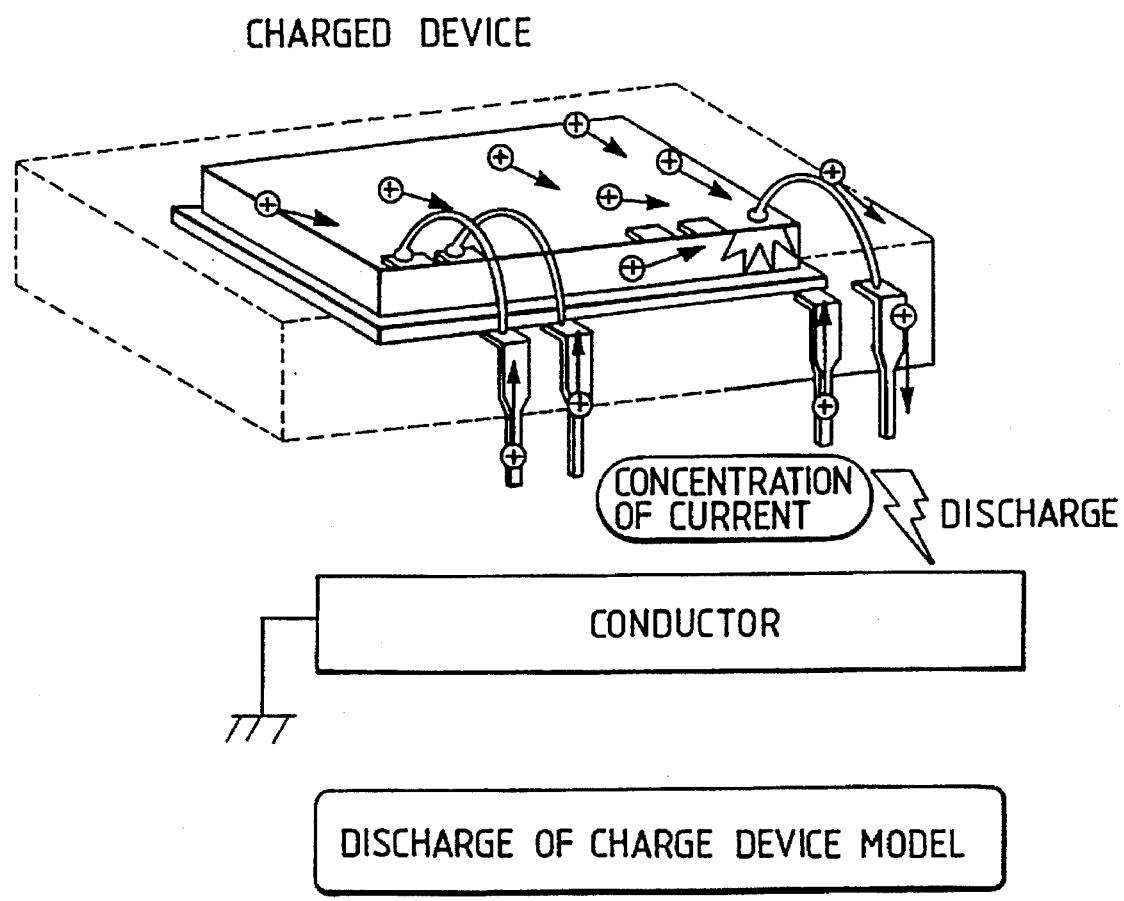
FIG. 19 is an explanatory view for explaining an electrostatic breakdown by the charge device model.

FIGS. 17A, 17B and 17C are external views showing an embodiment of a semiconductor device according to the present invention. FIG. 17A shows an example using a DIP/SOP type package which is equipped with leads on the two sides thereof. FIG. 17B shows an example using a ZIP type package which is equipped with leads only on one side thereof. FIG. 17C shows an example using a QFP type package which is equipped with leads on the fourth sides thereof.

Electrostatic breakdown of the charge device model occurs when one or some of the leads of the device contact with a conductor. Of the leads of the device, the leads having a high possibility of contacting with a conductor are the leads 2 which are positioned near the corners of a package 1, as shown in FIGS. 17A to 17C. The leads 3, as located in the central portions of the package 1, are considered to have a relatively low possibility of contacting with a conductor.

Thus, the data output buffer or data input buffer of the leads 2 disposed at the corner portions of the package 1, is equipped with the aforementioned electrostatic breakdown preventive circuit but the electrostatic breakdown preventive circuit by charge device model for the leads 3 in the central portions is omitted. As a result, the chip can be small-sized.

Alternatively, for the electrostatic breakdown prevention according to human body model, the possibility of contacting a human body is considered to be higher at the leads in the central portions of the package than at the leads in the corner portions because of handling by human hands. Thus, the leads 3 in the central portions are equipped with protective circuits in conformity with the human body model, as disclosed in the foregoing Publication. With this construction, it is possible to provide a semiconductor device in which a protective circuit effective for both the charge device model and the human body model is efficiently arranged.

The following effects can be obtained by the embodiments thus far described.

(1) Between an external terminal and the gate of one of output MOSFETs whose source or drain is connected to the external terminal, there is connected a P-channel type first protective MOSFET whose gate is connected to a high voltage side power supply terminal and which has a channel length equal to or larger than that of the output MOSFET, or an N-channel type second protective MOSFET whose gate is connected to a low voltage side supply terminal and which has a channel length equal to or larger than that of the output MOSFET. When the external terminal is discharged by device charge, one of the protective MOSFETs is turned on, and the charge on the gate side of the output MOSFET can be likewise released by device charge to produce the effect of preventing ESD (Electro-Static Discharge) breakdown.

(2) Between an external terminal and the source or drain of an input MOSFET whose gate is connected to the external terminal, the source or drain being for generating the output signal thereof, there is connected a P-channel type third protective MOSFET whose gate is connected to a high voltage side power supply terminal, or an N-channel type fourth protective MOSFET whose gate is connected to a low voltage side supply terminal. When the external terminal is discharged by device charge, one of the protective MOS- FETs is turned on, and the charge on the source or drain side of the output node of the input MOSFET is likewise released by device charge to produce the effect of preventing ESD breakdown.

(3) In the foregoing effects (1) and (2), the channel length of the protective MOSFET is made equal to or larger than that of the output MOSFET, so that it is not broken down by the charge, to produce the effect of enhancing the reliability.

(4) The first or second protective MOSFET of the foregoing effect (1) is arranged close to the corresponding output MOSFET, and the source or drain diffusion layer of the first or second protective MOSFET connected to the source or drain diffusion layer of the output MOSFET coupled to the external terminal is so arranged as not to be adjacent to the source or drain diffusion layer of the output MOSFET. As a result, there is produced an effect of discharging the internal node efficiently while preventing the PN junction between the source or drain of the MOSFET and the well created by the formation of a parasitic lateral transistor from being broken down by the discharge current.

(5) There is further provided a bipolar transistor whose base is connected to the gate of the output MOSFET on the power supply side, whose collector is connected to the drain of the output MOSFET, whose emitter is connected to the source, and in which the base is made in a semiconductor region formed simultaneously with a well region in which the output MOSFETs are made, the emitter is made in the diffusion layer formed simultaneously with the source or drain diffusion layer of the output MOSFET and the collector is the substrate. As a result, there is possible to produce an effect of affording two functions of preventing ESD breakdown with a simple construction and of accelerating the rise of the output signal.

(6) The output MOSFET is of a CMOS construction composed of a P-channel type third output MOSFET whose drain is connected through the resistance element to the external terminal and an N-channel type second output MOSFET whose drain is connected to the external terminal, and there is further provided a bipolar transistor whose collector is connected to the source of the third output MOSFET, whose emitter is connected to the external terminal and in which the base is made in a semiconductor region formed simultaneously with the well region in which the second output MOSFET is formed, the emitter is made in the diffusion layer formed simultaneously with the source or drain diffusion layer of the second output MOSFET and whose collector is the substrate. As a result, there is produced an effect of preventing ESD breakdown by a simple construction and accelerating the rise of the output signal. Between the gate and drain of the second output MOSFET, there is connected an N-channel type second protective MOSFET whose gate is connected to the low voltage side supply terminal. As a result, there is produced an effect of preventing ESD breakdown.

(7) Only the output MOSFETs or input MOSFETs corresponding to those of the external terminals of the semiconductor device, which are disposed in the end portions of the package, are equipped with protective MOSFETs. As a result, there is produced an effect of preventing ESD breakdown efficiently without enlarging the chip size.

Although our invention has been specifically described in connection with its embodiments, it should not be limited to the foregoing embodiments but can naturally be modified in various manners without departing from the gist thereof. For example, in the embodiments of FIGS. 10 to 13, the P-channel type output MOSFET P1 may be replaced by an N-channel type output MOSFET N1. In this modification, the drive circuit to be used can be the NOR gate circuit NO1 of FIG. 1.

In FIG. 2, the MOSFETs N3 and N4 can have higher breakdown voltages if they are composed of parasitic MOSFETs. Moreover, the MOSFETs N3 and N4 can be arranged in arbitrary positions, and the specific arrangement of the data output buffer, the wiring materials and the number of wiring layers are not restricted by the embodiments.

The description thus far made is directed to the case in which our invention is mainly applied to a large scale integrated circuit device such as a static RAM which the background of the invention, and to the data output buffer and the data input buffer of the device. Despite of this description, however, the present invention can be applied to circuits other than the data output buffer and the data input buffer, such as a variety of circuits including a MOSFET whose gate, source or drain is coupled to the external terminal. The invention can be further applied to a variety of memory integrated circuit devices including a dynamic RAM, and to a logical integrated circuit device including a gate array integrated circuit. In short, the present invention can be widely applied to semiconductor devices including a MOSFET at least gate, source or drain of which is coupled to the external terminal.

The effects to be obtained by the representative one of the invention disclosed herein will be briefly described in the following. Between an external terminal and the gate of the output MOSFET the source or drain of one of which is connected to the external terminal, there is connected a P-channel type first protective MOSFET whose gate is connected to the high voltage side power supply terminal and which has a channel length equal to or larger than that of the output MOSFET, or an N-channel type second protective MOSFET whose gate is connected to the low voltage side power supply terminal and which has a channel length equal to or larger than that of the output MOSFET. When the external terminal is discharged by device charge, one of the protective MOSFETs is turned on, and the charge on the gate side of the output MOSFET can be likewise released by the device charge to produce the effect of preventing ESD (Electro-Static Discharge) breakdown.

Between the external terminal and the source or drain of the input MOSFET whose gate is connected to the external terminal, the source or the output signal thereof, there is connected a P-channel type third protective MOSFET whose gate is connected to the high voltage side power supply terminal, or an N-channel type fourth protective MOSFET whose gate is connected to the low voltage side power supply terminal. When the external terminal is discharged by device charge, one of the protective MOSFETs is turned on, and the charge on the source or drain side of the output node of the input MOSFET is likewise released by device charge to produce the effect of preventing ESD breakdown.

In the above, the channel length of the protective MOSFET is made equal to or larger than that of the output MOSFET so that it is not broken down by the charge, to produce the effect of enhancing the reliability.

The first or second protective MOSFET is arranged close to the corresponding output MOSFET, and the source or drain diffusion layer of the first or second protective MOSFET connected to the source or drain diffusion layer of the output MOSFET coupled to the external terminal is so arranged as not be adjacent to the source or drain diffusion layer of the output MOSFET. As a result, there is produced an effect of discharging the internal node efficiently while preventing the PN junction between the source or drain of the MOSFET and the well due to production of a parasitic lateral transistor from being broken down by the discharge current.

There is further provided a bipolar transistor whose base is connected to the gate of the output MOSFET on the power supply side out of the said output MOSFETS, whose collector is connected to the drain of the output MOSFET, whose emitter is connected to the source, and in which the base is made in a semiconductor region formed simultaneously with the well region in which the output MOSFET is made, the emitter is made in the diffusion layer formed simultaneously with the source or drain diffusion layer of the output MOSFET and the collector is the substrate. As a result, there is possible to produce an effect of affording two functions of preventing ESD breakdown with a simple construction and of accelerating the rise of the output signal.

The output MOSFET is of a CMOS construction composed of a P-channel type third output MOSFET whose drain is connected through the resistance element to the external terminal and an N-channel type second output MOSFET whose drain is connected to the external terminal, and there is further provided a bipolar transistor whose collector is connected to the source of the third output MOSFET, whose emitter is connected to the external terminal and in which the base is made in a semiconductor region formed simultaneously with the well region in which the second output MOSFET is formed, the emitter is made in the diffusion layer formed simultaneously with the source or drain diffusion layer of the second output MOSFET and whose collector is the substrate. As a result, there is produced an effect of preventing ESD breakdown by a simple construction and accelerating the rise of the output signal. Between the gate and drain of the second output MOSFET, there is connected an N-channel type second protective MOSFET whose gate is connected to the low voltage side supply terminal. As a result, there is produced an effect of preventing ESD breakdown.

Only the output MOSFET or input MOSFET corresponding to those of the external terminals of the semiconductor device, which are disposed in the end portions of the package, are equipped with protective MOSFETs. As a result, there is produced an effect of preventing ESD breakdown efficiently without enlarging the chip size.

We claim:

1. A semiconductor device comprising:
    an external output terminal;
    a first terminal for receiving a power supply voltage;
    a second terminal for receiving a ground potential;
    a P-channel type output MOSFET having a source coupled to said first terminal and a drain coupled to said external output terminal;
    an N-channel type output MOSFET having a source coupled to said second terminal and a drain coupled to said external output terminal; and
    an N-channel type first protection MOSFET having a gate coupled to said second terminal and a source-drain path provided between a gate of said N-channel type output MOSFET and said external output terminal.

2. A semiconductor device according to claim 1, further comprising:
    an N-channel type second protective MOSFET having a gate coupled to said second terminal and a source-drain path provided between a gate of said P-channel type output MOSFET and said external output terminal.

3. A semiconductor device according to claim 2, wherein said first protective MOSFET has a channel length equal to or larger than that of said N-channel type output MOSFET.

4. A semiconductor device according to claim 1, further comprising:
    a resistor element provided between said drain of said P-channel type output MOSFET and said external output terminal.

5. A semiconductor device according to claim 4, wherein said resistor element is a diffusion resistor.

6. A semiconductor device according to claim 1, further comprising:
    a P-channel type second protective MOSFET having a gate coupled to said first terminal and a source-drain path provided between a gate of said P-channel type output MOSFET and said external output terminal.

7. A semiconductor device according to claim 6, further comprising:
    a resistor element provided between said drain of said P-channel type output MOSFET and said external output terminal.

8. A semiconductor device according to claim 7, wherein said first protective MOSFET has a channel length equal to or larger than that of said N-channel type output MOSFET.

9. A semiconductor device comprising:
    an external output terminal;
    a first terminal;
    a second terminal;
    a P-channel type output MOSFET having a source-drain path provided between said first terminal and said external output terminal;
    an N-channel type output MOSFET having a source-drain path provided between said second terminal and said external output terminal; and
    an N-channel type protective MOSFET having a gate coupled to said second terminal and a source-drain path provided between a gate of said N-channel type output MOSFET and said external output terminal.

10. A semiconductor device according to claim 9, wherein, during normal operation of said semiconductor device, said first terminal receives a power supply voltage and said second terminal receives a ground potential.

11. A semiconductor device according to claim 10, further comprising:
    a drive circuit coupled to a gate of said P-channel type output MOSFET and said gate of said N-channel type output MOSFET,
    wherein said P-channel type output MOSFET and said N-channel type output MOSFET are driven in a complementary manner to one another during said normal operation of said semiconductor device.

12. A semiconductor device comprising:
    an external output terminal;
    a first terminal;
    a second terminal;
    a first N-channel type output MOSFET having a source-drain path provided between said first terminal and said external output terminal;
    a second N-channel type output MOSFET having a source-drain path provided between said second terminal and said external output terminal; and
    an N-channel type protective MOSFET having a gate coupled to said second terminal and a source-drain path provided between a gate of said second N-channel type output MOSFET and said external output terminal;

wherein, during normal operation of said semiconductor device, said first terminal receives a power supply voltage and said second terminal receives a ground potential, and wherein said protective MOSFET has a channel length equal to or larger than that of said second N-channel type output MOSFET.

13. A semiconductor device according to claim 12, further comprising:

a drive circuit coupled to a gate of said first N-channel type output MOSFET, wherein said first and second N-channel type output MOSFETs are driven in a complementary manner to one another during said normal operation of said semiconductor device.

* * * * *